United States Patent [19]
Hahn et al.

[11] Patent Number: 5,170,073
[45] Date of Patent: Dec. 8, 1992

[54] ULTRA-LOW NOISE PORT OUTPUT DRIVER CIRCUIT

[75] Inventors: Michael G. Hahn, Folson; Joseph H. Salmon, Placerville; Robert E. Larsen, Shingle Springs, all of Calif.

[73] Assignee: Intel Corporation, Santa Clara, Calif.

[21] Appl. No.: 782,395

[22] Filed: Oct. 24, 1991

[51] Int. Cl.$^5$ .................. H03K 3/01; H03K 19/094
[52] U.S. Cl. .................. 307/270; 307/451; 307/263; 307/572; 307/594; 307/596; 307/605; 307/606
[58] Field of Search ............. 307/443, 263, 571–572, 307/450–451, 594, 596, 605–606, 270

[56] References Cited

U.S. PATENT DOCUMENTS

| | | | |
|---|---|---|---|
| 4,959,565 | 9/1990 | Knecht et al. | 307/448 |
| 4,992,676 | 2/1991 | Gerosa et al. | 307/263 |
| 5,036,232 | 7/1991 | Jungert et al. | 307/443 |
| 5,066,872 | 11/1991 | Schenck | 307/443 |

OTHER PUBLICATIONS

IBM Tech. Disc. Bul. "Rate of current charge controlled with low shoot through current" vol. 32 No. 8A Jan. 1990.

Primary Examiner—Andrew J. James
Assistant Examiner—Margaret Rose Wambach
Attorney, Agent, or Firm—Blakely, Sokoloff, Taylor & Zafman

[57] ABSTRACT

A circuit for providing digital output signals carrying large amounts of currents without generating large transients including apparatus for providing a first current path for providing current at a first rate and a first polarity, apparatus for providing a second current path for providing current at the first rate and the first polarity after a first delay, and apparatus for providing a third current path for providing current of the first polarity at a rate greater than the first rate and sufficient for a load connected thereto after a second delay equal to the first delay whereby the current available at the load has built to a level sufficient to sustain the load prior to the provision of the third current.

14 Claims, 3 Drawing Sheets

FIG_1

FIG_2

ULTRA-LOW NOISE PORT OUTPUT DRIVER CIRCUIT

BACKGROUND OF THE INVENTION

1. Field of The Invention

This invention relates to driver Circuits and, more particularly, to apparatus for switching high current digital output signals with a minimum of extraneous noise.

2. History Of The Prior Art

Digital circuitry is rapidly replacing mechanical devices and analog circuitry for controlling the operation of equipment. Digital circuits are typically small, operate rapidly, exhibit no signs of wear, and are inexpensive once in quantity production. However, many of the devices which are controlled require amounts of power to operate which are not necessarily typical to digital circuits. Consequently, it is often necessary to provide circuits which are capable of furnishing digital output signals which carry a great deal of current in order to provide the power necessary to operate other devices. Switching these high current output signals to output devices may generate a high level of transient noise. These transients are often so large that they may interfere with the operation of or actually damage the digital circuitry providing the output signals or any digital circuitry which may be associated therewith.

SUMMARY OF THE INVENTION

It is, therefore, an object Of the present invention to provide digital circuitry capable of switching high levels of output current without producing high levels of noise.

It is another, more specific, object of the present invention to provide digital circuitry capable of providing a plurality of individual signals for operating devices requiring high current levels.

These and other objects of the present invention are realized in a circuit for providing digital output signals carrying large amounts of currents without generating large transients at an output to a load comprising means for providing a first current path for providing current at a first rate and a first polarity to the output, means for providing a second current path for providing current at the first rate and the first polarity to the output after a first delay, and means for providing a third current path for providing current to the output of the first polarity at a rate greater than the first rate and sufficient for a load connected thereto after a second delay equal to the first delay whereby the current available at the load has built to a level sufficient to sustain the load prior to the provision of the third current.

These and other objects and features of the invention will be better understood by reference to the detailed description which follows taken together with the drawings in which like elements are referred to by like designations throughout the several views.

DETAILED DESCRIPTION OF THE INVENTION

Figure 1:
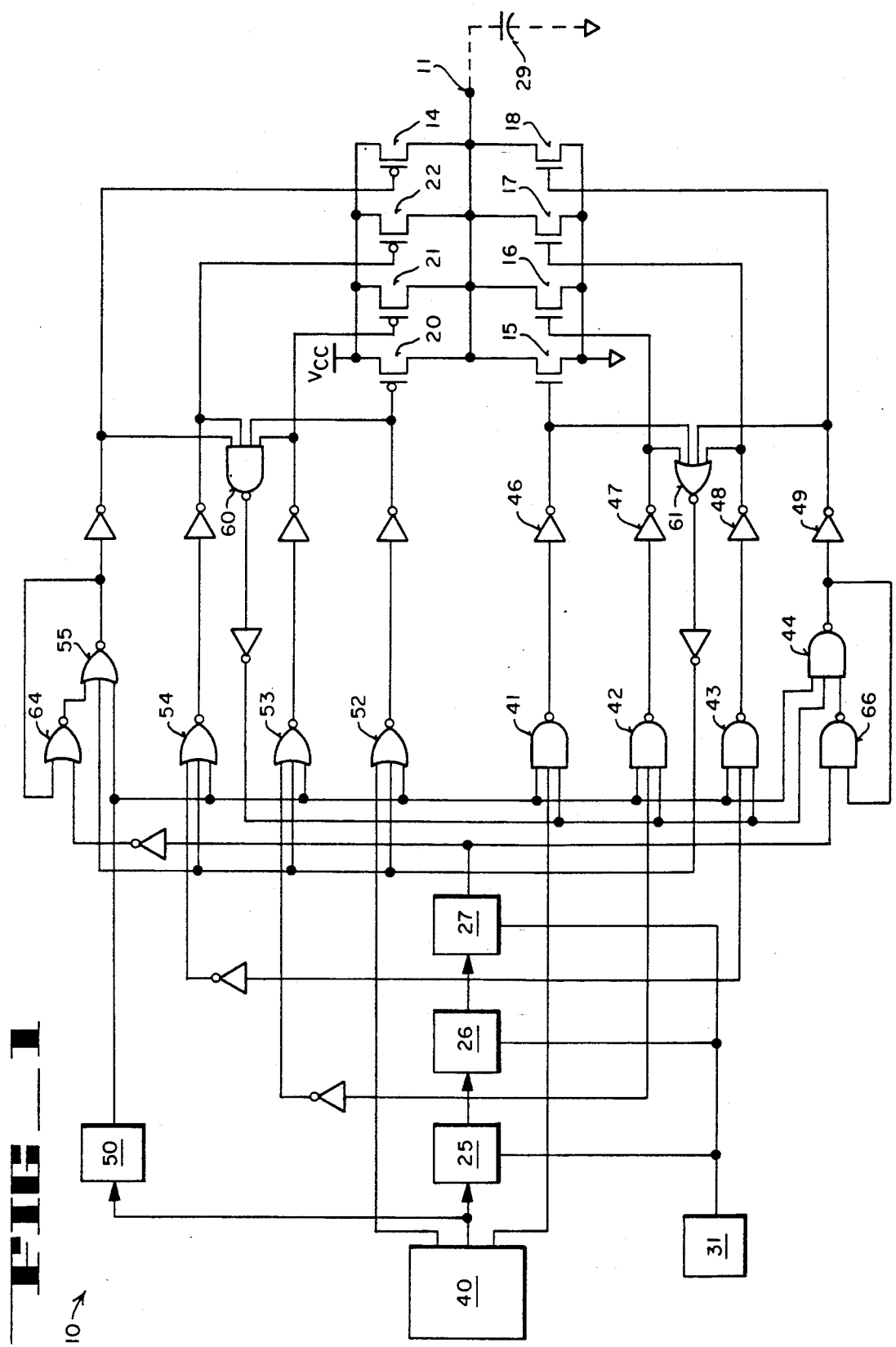
FIG. 1 is a partially-block partially-schematic diagram of circuitry designed in accordance with the present invention.

Referring now to FIG. 1, there is illustrated a circuit 10 designed in accordance with the present invention. The circuit 10 includes an output terminal 11 at which it is desired to present individual signals representing individual digital states of zero or one. The circuit 10 illustrated in FIG. 1 may be replicated a number of times (for example, eight) in order to provide bytes, words, or greater quantities of data simultaneously. As will be discussed in this specification, certain portions of the circuit 10 may suffice for a large number of additional circuits thereby rendering the circuitry generally economical.

The primary purpose of the circuit 10 is to provide digital output signals capable of driving circuitry requiring substantial levels of current. To this end, an N channel field effect transistor device 13 is arranged to provide a first voltage level such as ground at the output terminal 11 and a P channel device 14 is arranged to provide a second voltage level Vcc at the output terminal 11. Each of these signals may be selectively furnished to the output terminal 11 in response to signals applied to the gates of the devices 13 and 14. In order to switch the large amounts of currents required by an output device which may to be connected to the terminal 11 as the load, each of the devices 13 and 14 is designed to provide a substantial current path between the source and drain terminals. For example, the device 13 may have a channel width of 100 microns and a channel length of 2.4 microns while the device 14 may have a channel width of 250 and a channel length of 3 microns. These devices can be expected to furnish current values of 2.5 milliamperes at the operational characteristics of a preferred circuit.

As those skilled in the art will recognize, such current levels applied at the output to digital switching circuitry will typically generate very large transient values. These transients may and often do deleteriously affect the operation of digital circuits. Consequently, the circuit 10 has been designed in a manner that the large transients typically generated are eliminated. The circuitry generates signals having noise levels several orders of magnitude less than existing low noise buffers. Moreover, the scheme is simple and requires no feedback circuitry from the output terminal.

In order to accomplish this, the circuit 10 includes a plurality of N channel devices 15, 16, and 17 connected in a manner similar to the device 13 between a first voltage level and the output terminal 11. In a similar manner, the circuit 10 includes a plurality of P channel devices 20, 21, and 22 connected in a manner similar to the device 14 between a second voltage level and the output terminal 11. Each of the devices 15-17 and 20-22 is dimensioned so that it furnishes a relatively weak level of current (approximately 500 microamperes) when conducting. In order to accomplish this, the N devices, for example, are designed with a channel width of 7.4 microns and a channel length of L=5 whereas typical driver of this type might have channel widths of 400 microns and channel lengths of 3 microns. The P channel devices are dimensioned to provide similar values of current. Thus, each of these devices provides a relatively small flow of current when switched to conduction.

Each of devices has its gate connected to receive input from a different stage of a delay arrangement at a particular different time than the other devices arranged at the terminal 11. More particularly, a signal is provided to the gates of one of the N devices beginning at a first time and then, using a series of delay circuits 25, 26, and 27, signals are provided to the gates of the other N devices after first, second, and third equal delays. In a similar manner, a signal is provided to the gate of one of the P devices beginning at the first time followed by signals to the gates of the other P devices after the first, second, and third delays.

Figure 3:
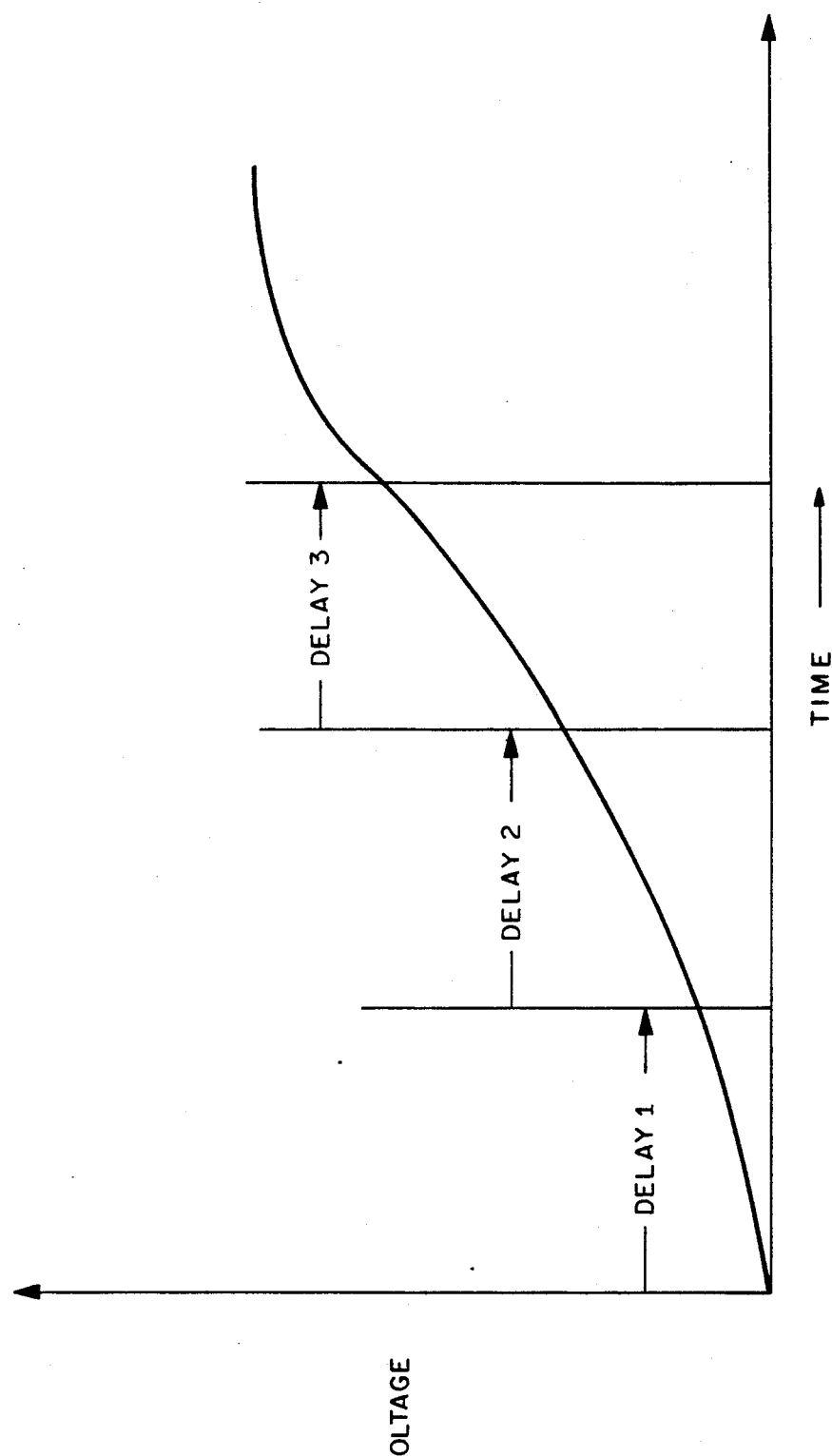
FIG. 3 is a diagram illustrating waveforms appearing at portions of the circuit of FIG. 1.

Consequently, before the high current device 13 (or 14) is turned on to switch current to the output terminal 11, a first device comes on and provides a first low level of current to the output terminal 11 for a first period of time. This current charges a capacitor 29 connected between the output terminal 11 and ground. Then a second device comes on and provides the same low level of current to the output terminal 11 along with the current from the first device for a second period of time. After the second period, a third device comes on and provides the same low level of current to the output terminal 11 along with the currents from the other devices for a third period of time. Thus, for a period of time selected by the delay circuits, current is provided to the output capacitor 29 so that a voltage builds up thereacross as a gradually increasing ramp function. A graph of the voltage buildup is illustrated in FIG. 3. In the preferred embodiment of the invention, the buildup occurs over a period of approximately 600 microseconds, although this time may be varied to suit the particular load by variations in the parameters of the delay circuits.

Finally, the high current device 13 or 14 is switched on. By this time, however, the capacitor 29 (which may include some portion of the inherent capacitance of the load) has charged to a voltage level such that there is no voltage drop across the source to drain terminals of the output devices. Thus, when the output device 13 or 14 comes on, there are no significant switching transients produced. The current switched by the device at the output, along with that furnished by the other devices connected to the terminal 11, is sufficient, however, to provide the current drive necessary for the particular load.

In order to provide the delays required by the circuit 10, each of the delay circuits 25-27 receives input from a delay reference circuit 31. This circuit 31 is designed to provide a voltage reference level which is independent of the voltage Vcc, the operating temperature, and the process of manufacture. Such a circuit is described in detail in U.S. patent application Ser. No. 07/589,698, entitled *CMOS Voltage Referency*, Sandeep K. Guliani, filed Sep. 28, 1990, and assigned to the assignee of the present invention. The use of the voltage provided by such a circuit 31 is explained in the description of the delay circuits 25-27 which follows.

Figure 2:
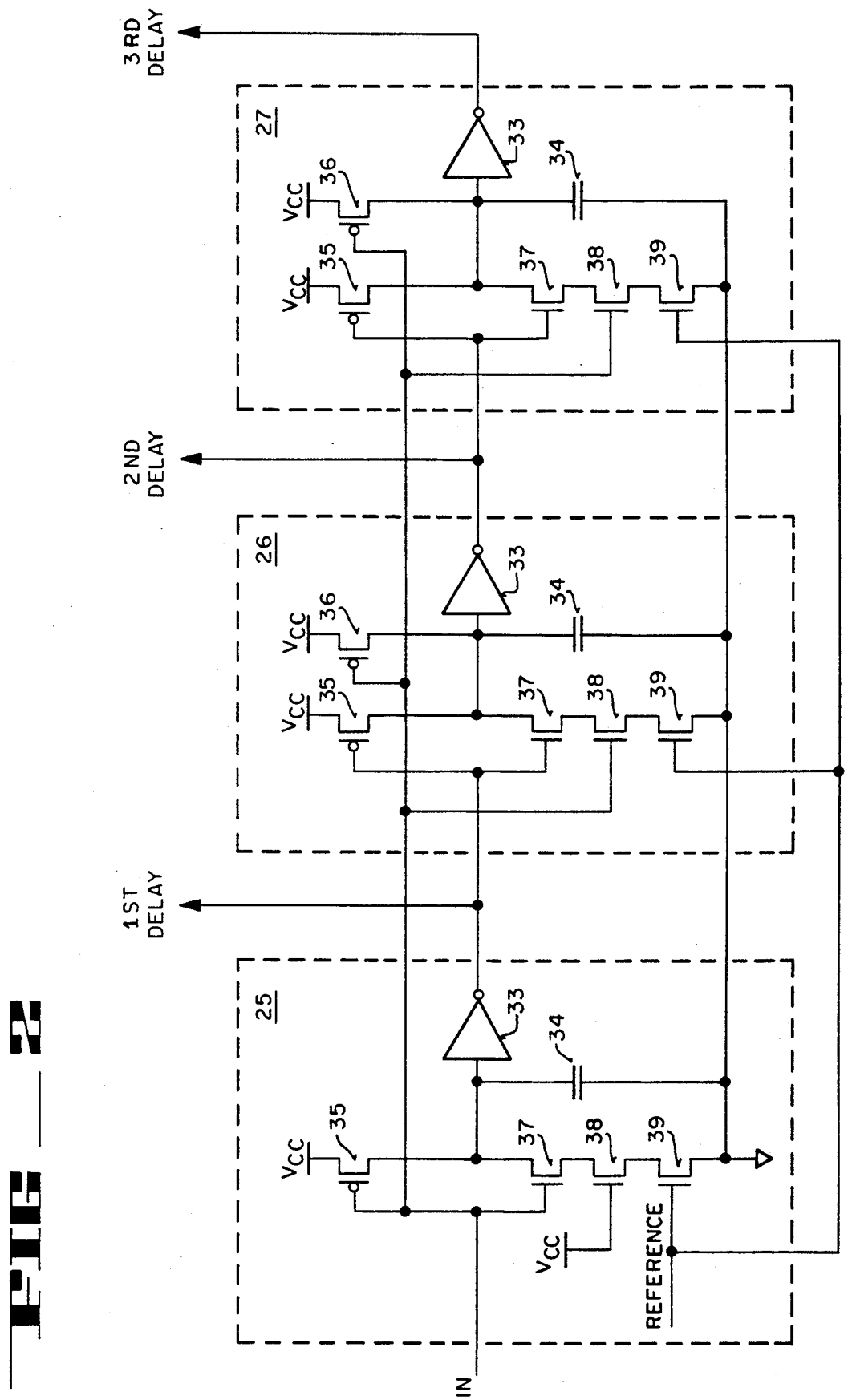
FIG. 2 is a circuit diagram illustrating in detail a portion of the circuit of FIG. 1.

FIG. 2 illustrates the three delay circuits 25-27 of FIG. 1 in detail. Each of the circuits 25-27 includes an inverter 33 having input and output terminals. A capacitor 34 is connected between the input terminal of the inverter 33 and ground. A P channel device 35 is arranged to provide current from a source of voltage Vcc to the capacitor 34. When the capacitor 34 is charged, it places the inverter in a high voltage condition so that a low or zero logic value is provided at its output terminal. Three N channel devices 37, 38, and 39 are connected in series to provide ground at the input terminal of the inverter 33 when they are conducting. The reference voltage from the reference circuit 31 is furnished to the gate of the device 39 and is chosen to maintain the device 39 in the saturation region in which it transfers essentially a constant current. The gates of the devices 35 and 37 each receive the same input signal.

Each of the delay circuits 26 and 27 also includes a P channel device 36 connecting Vcc to the capacitor 34. The gates of the devices 36 and 38 of the two delay circuits 26 and 27 all receive the input signal provided at the gate of the devices 35 and 37 of the first delay circuit 25.

When the input to the gates of the devices 35 and 37 is low (a zero), the device 35 is switched on and the device 37 is switched off. In delay circuit 25, this causes the capacitor 34 to charge through the device 35 to a positive value Vcc. The same low input value turns on the P devices 36 and turns off N devices 38 in each delay circuit 26 and 27 so that the capacitors 34 of all of the delay circuits 25-27 are charged simultaneously. The positive value on the capacitor 34 causes the inverter 33 of each delay circuit to conduct and provide a low (zero) value at its output terminal. This value from delay circuits 25 and 26 is transferred to the input terminals of the next delay circuits 26 causing the devices 35 to conduct. Thus, a zero at the input terminal of the device 35 of the first delay circuit 25 causes the capacitors 34 of all three delay circuits to charge simultaneously and the inverters 33 to produce outputs of zero.

When a one value is received at the gates of the devices 35 and 37 of the first delay circuit 25, the device 35 is switched off and the device 37 is switched on. The devices 37, 38, and 39 of delay circuit 25 then provide a path to ground to discharge the capacitor 34. The reference voltage at the gate to the device 39 controls the amount of current transferred to be relatively constant over the time during which the devices are transferring current prior to the time at which the inverter 33 switches (when the voltage at the input terminal has been reduced to approximately Vcc/2) and provides a one at its output terminal. Since the discharge rate of the capacitor 34 is controlled by the device 39 to be relatively constant, a smooth discharge occurs which is not affected by Vcc, temperature, or process. Thus, the delay provided by the circuit 25 remains relatively constant.

When the device 35 of the first delay circuit switches off, the devices 36 of the circuits 26 and 27 also switch off; and the devices 38 of those circuits switch on. However, the capacitors 34 of the delay circuits 26 and 27 remain charged by the current provided by the paths through the 35 of the circuits 26 and 27. Thus, those delay circuits 26 and 27 continue to furnish zero values at their output terminals.

When the inverter 33 of the delay circuit 25 switches and provides a one at its output terminal, the device 35 of the second delay circuit switches off and the device 37 of that circuit switches on, initiating a timed discharge of the capacitor 34 of the second delay circuit. When the voltage on the capacitor 34 reaches the appropriate level, the inverter 33 of the second circuit 26 switches and provides a one at its output. This one, in turn, causes the third delay circuit 27 to begin its timed delay period at the end of which a one is provided at its output terminal.

The value one provided at the input of the first delay circuit 25 is furnished by a reset and write logic circuit 40 shown in FIG. 1. This value is also provided to an NAND gate 41. If a one (to be furnished after inversion as a zero output value at terminal 11) is held in a data latch 50, the gate 41 furnishes a zero to an inverter 46 connected to the gate of the device 15. This turns on the device 15. After the delay of the first delay circuit 25, a one is similarly furnished to a NAND gate 42 which propagates a one in the data latch 50 to the gate of the device 16 to turn on that device. After the delay of the second delay circuit 26, a one is similarly furnished to a NAND gate 43 which propagates a one in the data latch 50 to the gate of the device 17 to turn on that device. Thus, after two delay periods, three N channel devices 15-17 are furnishing relatively low amounts of current to build up the charge on the output capacitor 29. Finally, when the third delay period has expired, a one is similarly furnished to a NAND gate 44 which propagates a one in the data latch 50 to the gate of the device 13 to turn on that device and allow relatively large amounts of current to flow to the output terminal 11 without, however, generating large transients.

In a similar manner, the value one provided at the input of the first delay circuit 25 is inverted and furnished by the reset and write logic circuit 40 to a NOR gate 52. If a zero is held in the data latch 50, the gate 52 furnishes a one to an inverter connected to the gate of the P channel device 20. This turns on the device 20. After the delay provided by the first delay circuit 25, a one is similarly inverted and furnished to a NOR gate 53 which propagates a zero in the data latch 50 to the gate of the P channel device 21 to turn on that device. After the delay provided by the second delay circuit 26, a one is similarly inverted and furnished to a NOR gate 54 which propagates a zero in the data latch 50 to the gate of the P channel device 22 to turn on that device. Thus, after two delay periods, three devices 20-22 are furnishing relatively low amounts of current to build up the charge on the output capacitor 29. Finally, when the third delay period has expired, a one provided by the delay circuit 27 is similarly inverted and furnished to a NOR gate 55 which propagates a zero in the data latch 50 to the gate of the device 14 to turn on that device and allow relatively large amounts of current to flow to the output terminal 11 without, however, generating large transients.

It will be appreciated by those skilled in the art that the delay circuits 25-27 need not be duplicated for each of the circuits 10 driving an output terminal 11. Instead, a single set of delay circuits 25-27 may provide the signals used for turning on the drivers for eight, sixteen, or some other larger number of circuits 10 all of which furnish output signals to terminals 11 simultaneously.

In order to assure that the N device drivers do not connect ground to the terminal 11 when the P device drivers connect Vcc thereto (and vice versa), the circuit 10 also includes a NAND gate 60 which is used to provide a feedback signal to each of the NAND gates 41-44 to assure that the N devices furnishing the low output are all turned off whenever one of the P devices 14, 20-22 is turned on. In a similar manner, a NOR gate 61 receives a feedback signal whenever one of the N devices 13, 15-17 turns on. This signal is propagated by the NOR gates 52-55 to assure that the P device drivers are turned off.

After each individual output signal furnished to the terminal 11 by all four of the device drivers providing current to generate either a zero or a one, the output drivers are reset. In this manner, delayed charging is used to generate each output signal so that excess noise is eliminated from each signal. However, the load connected to the terminal 11 may require that a series of the same value signals in sequence cause an electromechanical device such as a solenoid to remain in a single state. In order to assure that the reset pulse does not interrupt the current at the output terminal 11 and cause such a device to start switching its state in response to a series of sequential one signals, for example, furnished to the output terminal 11, the value furnished at the NOR gate 55 is fed back to a NOR gate 64 to maintain the P device 14 in a conducting condition during the reset condition which interrupts a series of one value outputs. In a similar manner, the value furnished at the NAND gate 44 is fed back to a NAND gate 66 to maintain the N device 13 in a conducting condition during the reset condition. In this manner, the circuit 10 may operate with load devices such as solenoids without interrupting the current provided when a string of signals of the same value are being sent to the terminal 11.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for providing digital output signals carrying large amounts of currents without generating large transients comprising means for providing a first current path for providing current of a first value and a first polarity to an output, means for providing a second surrent path for providing current of the first value and the first polarity to the output after a first delay, and means for providing a third current path to the output for providing current of the first polarity of a value which is greater than the sum of the values provided by the first and second current paths after a second delay equal to the first delay whereby the current available at the load has built to a level prior to the provision of a third current that the provision of the third current path does not generate significant transients.

2. A circuit for providing digital output signals carrying large amounts of currents without generating large transients as claimed in claim 1 further comprising means for providing a fourth current path for providing current of the first value and a second polarity to the output, means for providing a fifth current path for providing current of the first value and the second polarity to the output after the first delay, and means for providing a sixth current path to the output for providing current of the second polarity of a value which is greater than the sum of the values provided by the first and second current paths after the second delay.

3. A circuit for providing digital output signals carrying large amounts of currents without generating large transients as claimed in claim 2 further comprising means for disabling any means for providing current of a first polarity whenever any means for providing current of a second polarity is enabled, and means for disabling any means for providing current of a second polarity whenever any means for providing current of a first polarity is enabled.

4. A circuit for providing digital output signals carrying large amounts of currents without generating large transients comprising means for providing a first current path for providing current of a first value and a first polarity to an output, means for providing a second current path for providing current of the first value and the first polarity to the output after a first delay, and means for providing a third current path to the output for providing current of the first polarity of a second value which is greater than the sum of the values provided by the first and second current paths after a second delay equal to the first delay whereby the current available at the load has built to a level prior to the provision of a third current that the provision of the third current path does not generate significant transients;

means for providing a fourth current path for providing current of the first value and a second polarity to the output, means for providing a fifth current path for providing current of the first value and the second polarity to the output after the first delay, and means for providing a sixth current path to the output for providing current of the second polarity of a value which is greater than the sum of the values provided by the fourth and fifth current paths after the second delay;

means for disabling any means for providing current of a first polarity whenever any means for providing current of a second polarity is enabled;

means for disabling any means for providing current of a second polarity whenever any means for providing current of a first polarity is enabled; and means for maintaining current delivered to a load during a series of digital signals of the same polarity.

5. A circuit for providing digital output signals carrying large amounts of currents without generating large transients comprising means for providing a first current path for providing current of a first value and a first polarity to an output, means for providing a second current path for providing current of the first value and the first polarity to the output after a first delay, means for providing a third current path for providing current of the first value and the first polarity to the output after a second delay, and means for providing a fourth current path to the output for providing current of the first polarity of a value greater than the sum of the values provided by the first, second, and third current paths after a third delay equal to the first delay whereby the current available at the load has built to a level prior to the provision of current from the fourth current path that the provision of the fourth current path does not generate significant transients.

6. A circuit for providing digital output signals carrying large amounts of currents without generating large transients as claimed in claim 5 in which each of the means for providing a first, second, and third current path for providing current of a first value and the first polarity to the output comprises a transistor capable of carrying current of a first value connected between the output and a first level of voltage, the means for providing a fourth current path for providing current of a value greater than the sum of the values provided by the first, second, and third current paths and the first polarity to the output comprises a transistor capable of carrying current of a second value connected between the output and a first level of voltage, and means for providing signals to enabled the transfers of current by the transistors between the source and the output at spaced intervals.

7. A circuit for providing digital output signals carrying large amounts of currents without generating large transients as claimed in claim 6 in which the means for providing signals to enabled the transfers of current by the transistors between the source and the output at spaced intervals comprises a circuit for providing output pulses after essentially equal periods of time.

8. A circuit for providing digital output signals carrying large amounts of currents without generating large transients comprising means for providing current of a first value from a plurality of different sources, means for providing from an additional source current of a second value greater in total than the current provided by the plurality of different sources, and means for connecting the plurality of different sources and the additional source to furnish current to a load in a sequence of essentially equal time intervals ending with connection of the additional source in which the means for providing current of a first value from a plurality of different sources comprises a plurality of transistor devices having a first current-carrying capacity arranged between the output and a source of voltage, the means for providing from an additional source current of a second value comprises a transistor device having a second current-carrying capacity arranged between the output and the source of voltage, and the means for connecting the plurality of different sources and the additional source to furnish current to a load in a sequence of essentially equal time intervals ending with connection of the additional source comprises a plurality of delay circuits arranged to provide sequentially pulsed output signals for operating the transistor devices.

9. A circuit for providing digital output signals carrying large amounts of currents without generating large transients comprising means for providing current of a first value from a plurality of different sources, means for providing from an additional source current of a second value greater in total than the current provided by the plurality of different sources, means for connecting the plurality of different sources and the additional source to furnish current to a load in a sequence of essentially equal time intervals ending with connection of the additional source the means for providing current of a first value from a plurality of different sources comprises a plurality of transistor devices having a first current-carrying capacity arranged between the output and a source of voltage, the means for providing from an additional source current of a second value comprises a transistor device having a second current-carrying capacity arranged between the output and the source of voltage, and the means for connecting the plurality of different sources and the additional source to furnish current to a load in a sequence of essentially equal time intervals ending with connection of the additional source comprises a plurality of delay circuits arranged to provide sequentially pulsed output signals for operating the transistor devices, each of the delay circuits arranged to provide sequentially pulsed output signals for operating the transistor devices comprising an inverter having input and output terminals, a capacitor at the input terminal of the inverter, means for storing a voltage equivalent to a first logic value on the capacitor, and means for discharging the capacitor at a constant rate during a period until the inverter switches.

10. A circuit for providing digital output signals carrying large amounts of currents without generating large transients as claimed in claim 9 in which the output of the inverter of each of the delay circuits in sequence is connected to operate the means for discharging the capacitor of a next delay circuit.

11. A circuit for providing digital output signals of first and second voltage levels carrying large amounts of currents at an output terminal without generating large transients comprising first means for providing gradually increasing amounts of current from a voltage source at the first voltage level to the output terminal, second means for providing gradually increasing amounts of current from a voltage source at the second voltage level to the output terminal, means for disabling the second means for providing gradually increasing amounts of current when the first means is operating, and means for disabling the first means for providing gradually increasing amounts of current when the second means is operating in which each of the means for providing gradually increasing amounts of current from a voltage source at a voltage level to the output terminal comprises means for providing a first low current path between the voltage source and the output terminal, means for providing a second low current path between the voltage source and the output terminal after a first delay, and means for providing a third high current path between the voltage source and the output terminal after a second delay whereby the transients caused by switching the current by the third current path to the output terminal are insufficient to affect the operation of the current.

12. A circuit for providing digital output signals of first and second voltage levels as claimed in claim 12, each of the means for providing gradually increasing amounts of current from a voltage source to the output terminal further comprising means for providing a first signal for turning on the first low current path and generating the first delay, means for turning on the second low current path and generating the second delay at the end of the first delay, and means for turning on the third high current path at the end of the second delay.

13. A circuit for providing digital output signals of first and second voltage levels as claimed in claim 12, each of the means for providing first, second, and third current paths between a source of voltage and the output terminal comprising a transistor.

14. A circuit for providing digital output signals of first and second voltage levels as claimed in claim 13, each of the means for providing first, second, and third current paths between a source of voltage and the output terminal comprising a field effect transistor connected with its source and drain between the voltage source and the output terminal.

* * * * *

UNITED STATES PATENT AND TRADEMARK OFFICE
CERTIFICATE OF CORRECTION

PATENT NO. : 5,170,073
DATED : December 8, 1992
INVENTOR(S) : Michael G. Hahn, et. al.

It is certified that error appears in the above-indentified patent and that said Letters Patent is hereby corrected as shown below:

```
Column 3, line 52, delete "Referency" insert -- Reference--
Column 10, line 7, delete "current" insert -- circuit--
Column 10, line 9, delete "delete "claim 12" insert --claim 11--
```

Signed and Sealed this

Twenty-sixth Day of September, 1995

*Attest:*

BRUCE LEHMAN

*Attesting Officer*   Commissioner of Patents and Trademarks